Nov. 28, 1967 J. L. WILLIAMS ETAL 3,355,673

MULTIPHASE OSCILLATOR WITH FREQUENCY VARIABLE BY SATURABLE MAGNETIC COMPONENTS

Filed Feb. 1, 1966 3 Sheets-Sheet 1

MULTIPHASE OSCILLATOR WITH FREQUENCY VARIABLE BY SATURABLE MAGNETIC COMPONENTS

Filed Feb. 1, 1966 3 Sheets-Sheet 2

United States Patent Office 3,355,673

Patented Nov. 28, 1967

3,355,673

MULTIPHASE OSCILLATOR WITH FREQUENCY VARIABLE BY SATURABLE MAGNETIC COMPONENTS

John Llewellyn Williams, Chester, and Philip John Stokes, Liverpool, England, assignors to United Kingdom Atomic Energy Authority, London, England Filed Feb. 1, 1966, Ser. No. 524,209
Claims priority, application Great Britain, Feb. 5, 1965, 5,089/65
3 Claims. (Cl. 331—45)

ABSTRACT OF THE DISCLOSURE

A multiphase variable frequency oscillator for use with electric induction or hysteresis motors to enable the speeds of the motors to be adjusted. A number of substantially identically tuned semiconductor stages are coupled together by a phase-shifting network and for each phase there are two separable magnetic tuning means, each having a primary winding and a control winding so arranged that if the currents in the primary winding and control winding of one magnetic component instantaneously reinforce each other, then at that instant the currents in the primary and control windings of the other two components oppose each other.

The present invention concerns multiphase variable frequency oscillators particularly for use in conjunction with electric induction or hysteresis motors to enable the speeds of the motors to be adjusted.

According to the present invention a multiphase variable frequency oscillator comprises a number of substantially identical variably tuned circuit stages coupled together in a closed loop by phase shifting networks.

A convenient form of oscillator uses saturable magnetic inductors or transformers in the tuned tank circuits that is to say parallel inductance capacitance circuits within the various stages to control the frequency of oscillation. The stages would act as independent oscillators but because they are coupled together they will interfere with each other and are drawn into a definite phase displaced relationship. The phase shifting networks serve to prevent the stages oscillating in phase or in antiphase with each other and their precise component values are not critical to the frequency of oscillation; however the phases shifting networks will tend to pull the frequency to a slight extent.

The phase shifting networks are preferably simple resistance capacitance circuits and phase reversal networks are not intended to be covered by the phrase "phase-shifting networks."

Figure 1:
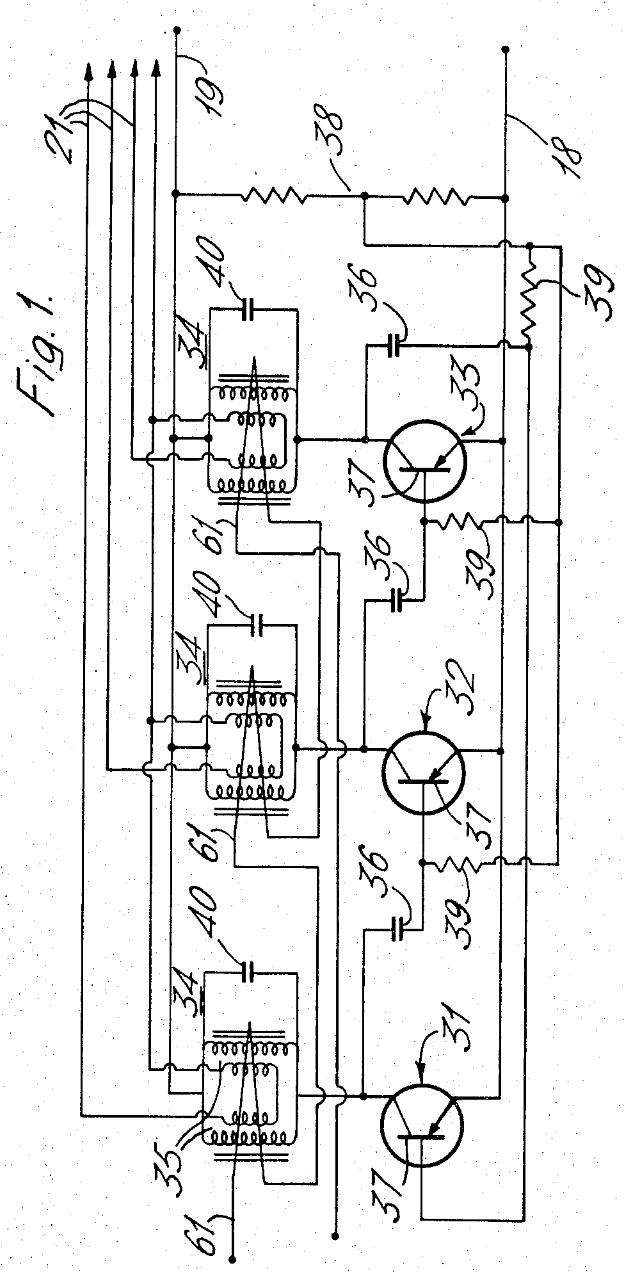
Figure 2:
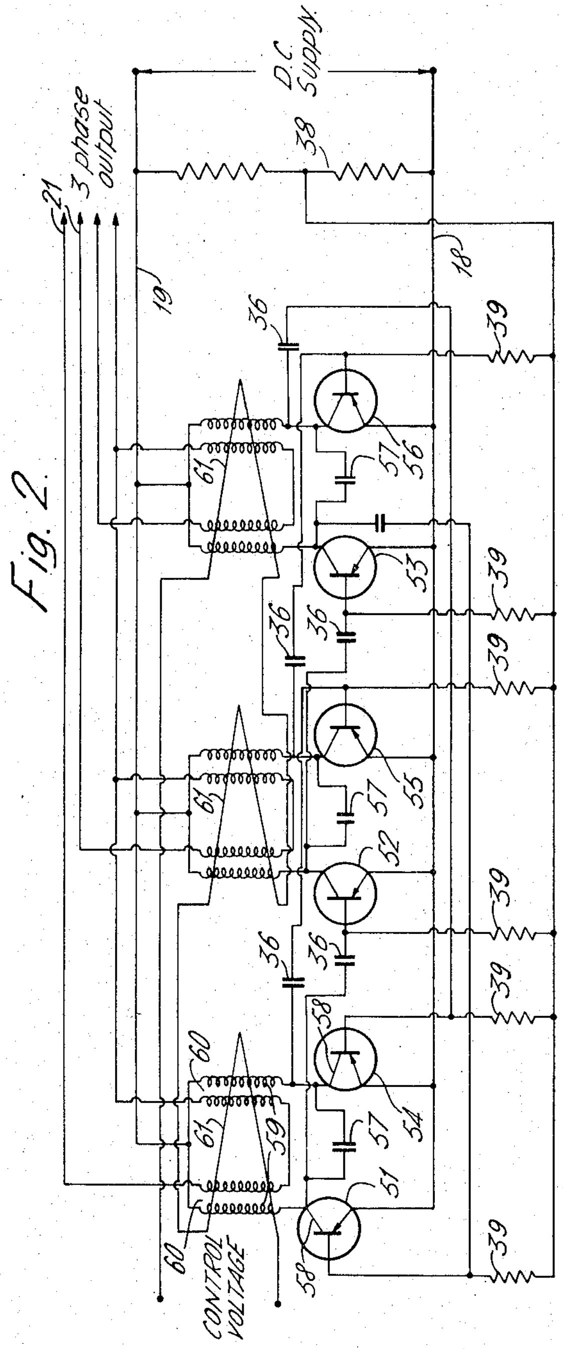
Figure 3:
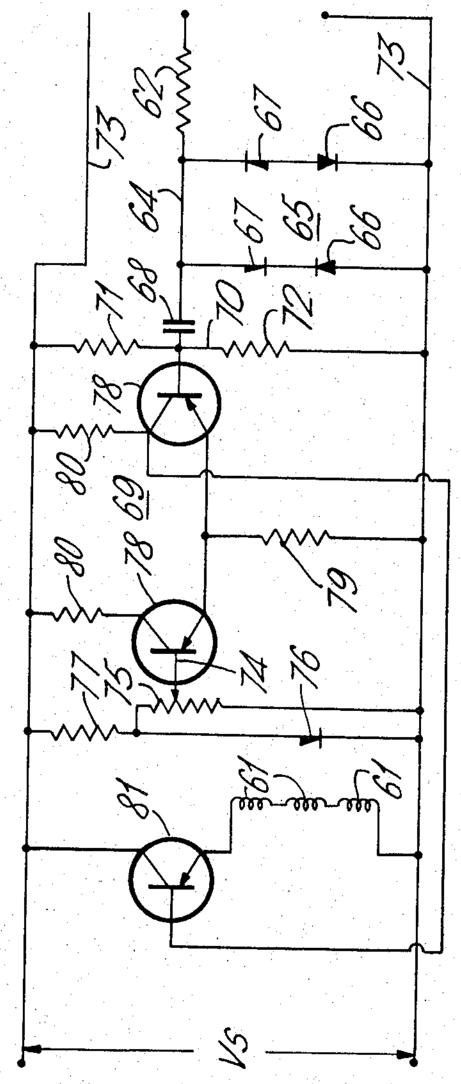

Two embodiments of the invention and a frequency stabilising circuit will now be described by way of example with reference to the accompanying drawings in which FIGURE 1 shows a three phase variable frequency oscillator circuit employing saturable transformers, FIGURE 2 is a circuit diagram showing a push-pull modification of the circuit of FIGURE 1 and FIGURE 3 illustrates a frequency stabilising circuit for use with the embodiments of FIGURE 1 and FIGURE 2.

The oscillator shown in FIGURE 1 is a three phase oscillator consisting of three tuned circuit stages 31, 32 and 33. Each stage consists of a P-N-P transistor connected in a common emitter configuration. The collector load 34 of each stage contains a saturable transformer assembly, that is, two saturable transformers 35 matched and connected to each other so as to yield a comparatively undistorted output.

Coupling between the stages is by means of a resistive capacitance phase shifting circuit, the bases of the transistors being connected to the collector of the preceding stage through a capacitor 36 and to a tapping of a biassing potential divider 38 through bias resistors 39. The emitters of the transistors are connected to a voltage supply line 18.

Each transformer assembly is rendered oscillatory by a capacitor 40 connected in parallel across the assembly.

The transformer assemblies comprise two transformers each with a primary winding 59, a secondary winding 60, and a magnetising winding 61. The two primary windings in each assembly are connected in parallel between the collector and a voltage supply line 19, the two secondary windings are connected in series and the two magnetising windings 61 in series opposition so that no alternating voltage is induced into the source. The magnetising windings 61 are connected in a series circuit which is energised so as to vary the inductance of the transformers and so vary the frequency of oscillation. The output 21 is taken as a star connected three phase voltage from the secondary windings, the voltage being free of unidirectional components due to the transformer action of the saturable transformer assemblies.

The embodiment of FIGURE 2 is a push pull version of the embodiment of FIGURE 1.

It is most easily understood as consisting of three tuned circuit stages with two transistors in push pull but it may also be regarded as two three-phase oscillators akin to those shown in FIGURE 1 arranged back-to-back.

Regarding it first as two three-phase oscillators back to back each oscillator comprises three common emitter transistor circuits 51, 52 and 53 or 54, 55 and 56.

Transistor circuits 51, 52 and 53 are interconnected as in the embodiment of FIGURE 1 by capacitors 36 and have bias resistors 39 and so are transistor circuits, 54, 55 and 56.

However each of the transistor circuits 51, 52 and 53 is only oscillatory in cooperation with a respective one of the transistor circuits 54, 55 and 56. The collector load of each transistor circuit is a primary winding 59 of a saturable transformer which winding is connected between the collector 58 and a voltage supply line 19. Two transistor circuits 51 and 54, 52 and 55 or 53 and 56 thus share a saturable transformer assembly between them and each pair can deliver from secondary windings of the saturable transformer assemblies an output on lines 21 which is comparatively free of distortion and unidirectional components. The saturable transformer assemblies are rendered oscillatory by a capacitor 57 connected between the collectors 58 of the pairs of circuits 51 and 54, 52 and 53, or 53 and 56; this capacitor will resonate and ensure that the collectors are in antiphase. Again the frequency of oscillation is determined by a control voltage applied to control windings 61 which are connected in series.

Whilst this control voltage may be established by a simple variable potential divider, more stable control can be attained by deriving a signal representative of the difference between the actual frequency and that required. FIGURE 3 shows a circuit for deriving such a signal. One phase of the oscillator output is connected through a current limiting resistor 62 to an input line 64 and a voltage limiting rectifier network 65. The voltage limiting network 65 consists of two branches connecting the input line to earth or other fixed potential supply line, each branch consisting of a zener diode 66 and a rectifier diode 67 connected in series opposition, the polarities of the zener doides and the rectifier diodes in the two branches being reversed. The resulting input is now effectively a square wave which is passed through a capacitor 68 to one input of a difference amplifier 69 and to the common point 70 of a resistor chain, consisting of resistor 71, 72, connected between the supply lines 73. The supply lines 73 will generally be the supply lines 18, 19 of FIGURES 1 and 2.

The other input 74 of the difference amplifier is connected to a potentiometer 75 connected across a zener diode 76 which co-operates with a resistor 77 to give a stable voltage in the usual way. The difference amplifier 69 consists of two common emitter P-N-P transistor circuits 78 having a common bias resistor 79 in the emitter circuit; the output of the difference amplifier is obtained from a collector load resistor 80 preferably that of the transistor connected to the capacitor 68. The output from the difference amplifier controls a current regulating transistor 81 connected in series with the saturating windings 61 of the saturable transformers. The saturating current in the winding 61 will be a square wave superimposed on a main direct current but because of the slow response of saturable components the effect will be almost entirely that of the mean direct current. A less complicated circuit in which the phase of the oscillator output is connected through a current limiting resistor to the base of the transistor with a zener diode, a rectifier diode and a capacitor connecting the base to earth so that the capacitor integrates unidirectional (by virtue of the rectifier diode) amplitude limited (by virtue of the zener diode) pulses could be used in certain circumstances.

We claim:

1. A multiphase oscillator comprising a number of substantially identical variably tuned semiconductor circuit stages coupled together by a phase shifting network, the improvement residing in that for each phase there are two saturable magnetic components serving as the variable tuning means and each having a primary winding and a control winding so arranged that if the currents in the primary winding and control winding of one magnetic component instantaneously reinforce each other then at that instant the currents in the primary winding and the control winding of the other of the two components oppose each other.

2. A multiphase oscillator according to claim 1 further comprising a frequency stabilising circuit comprising a pulse shaping network for receiving an input from one phase of the oscillator's output and converting it into a synchronised train of standardised pulses, a source of reference direct current, a differential amplifier connected to said source and to said network to compare said train with said reference direct current and to yield an output to control a transistor regulating the flow of current through the control windings of the saturable components.

3. A multiphase oscillator comprising a plurality of substantially identical variably tuned semiconductor circuit stages coupled together by a phase-shifting network wherein the variable tuning means comprises saturable magnetic transformer assemblies, each transformer assembly comprising two saturable transformers, each transformer having a primary winding, a secondary winding and a magnetizing winding, with the two primary windings in each assembly being connected in parallel, the two secondary windings connected in series, and the two magnetizing windings connected in series opposition.

References Cited

UNITED STATES PATENTS

| | | | |
|---|---|---|---|
| 2,017,708 | 10/1935 | Bedford | 331—57 |

FOREIGN PATENTS

| | | |
|---|---|---|
| 1,007,818 | 5/1952 | France. |
| 1,010,063 | 6/1952 | France. |
| 858,114 | 1/1961 | Great Britain. |
| 955,544 | 4/1964 | Great Britain. |

JOHN KOMINSKI, *Primary Examiner.*

ROY LAKE, *Examiner.*